(12) United States Patent
Okude et al.

(10) Patent No.: US 10,456,844 B2
(45) Date of Patent: Oct. 29, 2019

(54) SURFACE-COATED CUTTING TOOL

(71) Applicant: MITSUBISHI MATERIALS CORPORATION, Tokyo (JP)

(72) Inventors: Masaki Okude, Naka (JP); Kenji Yamaguchi, Naka (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 102 days.

(21) Appl. No.: 15/312,922

(22) PCT Filed: May 29, 2015

(86) PCT No.: PCT/JP2015/065558
§ 371 (c)(1),
(2) Date: Dec. 22, 2016

(87) PCT Pub. No.: WO2015/182746
PCT Pub. Date: Dec. 3, 2015

(65) Prior Publication Data
US 2017/0182567 A1 Jun. 29, 2017

(30) Foreign Application Priority Data

May 30, 2014 (JP) .................................. 2014-112772
May 21, 2015 (JP) .................................. 2015-104021

(51) Int. Cl.
*B23B 27/14* (2006.01)
*B23C 5/16* (2006.01)
(Continued)

(52) U.S. Cl.
CPC ................ *B23C 5/16* (2013.01); *B23B 27/14* (2013.01); *C23C 16/0272* (2013.01);
(Continued)

(58) Field of Classification Search
USPC .......... 51/307, 309; 428/216, 336, 469, 698, 428/701, 702
See application file for complete search history.

(56) References Cited

U.S. PATENT DOCUMENTS 4,619,866 A * 10/1986 Smith ................. C04B 41/5031
428/701
7,201,956 B2 * 4/2007 Oshika ................ C23C 16/0272
428/336

(Continued)

FOREIGN PATENT DOCUMENTS

CN          101048250 A     10/2007
CN          101094934 A     12/2007
(Continued)

OTHER PUBLICATIONS

Office Action dated Jan. 11, 2018 for the corresponding Chinese Patent Application No. 201580037433.7.
(Continued)

*Primary Examiner* — Archene A Turner
(74) *Attorney, Agent, or Firm* — Leason Ellis LLP

(57) ABSTRACT

In a surface-coated cutting tool, a hard coating layer composed of a lower layer and an upper layer is deposited on a surface of a tool body made of a WC-based cemented carbide or a TiCN-based cermet. The lower layer has at least one Ti compound layer made of a TiCN layer and the upper layer is made of an α-type $Al_2O_3$ layer. In a case where, regarding $Al_2O_3$ crystal grains of the entire upper layer, a constituent atom-sharing lattice point distribution is measured, a highest peak is present in Σ3, and a distribution ratio of Σ3 is 70% or more. A ratio of a Σ3-coincidence grain boundary continuing from an interface between the lower layer and the upper layer to an outermost surface of the upper layer is 60% or more of a Σ3-coincidence grain boundary of the upper layer.

7 Claims, 2 Drawing Sheets

(51) Int. Cl.
  *C23C 16/36* (2006.01)
  *C23C 16/40* (2006.01)
  *C23C 16/06* (2006.01)
  *C23C 16/32* (2006.01)
  *C23C 16/34* (2006.01)
  *C23C 16/02* (2006.01)

(52) U.S. Cl.
  CPC .............. *C23C 16/06* (2013.01); *C23C 16/32* (2013.01); *C23C 16/34* (2013.01); *C23C 16/36* (2013.01); *C23C 16/40* (2013.01); *C23C 16/403* (2013.01)

(56) References Cited

U.S. PATENT DOCUMENTS

| | | | | |
|---|---|---|---|---|
| 7,442,433 | B2* | 10/2008 | Honma | C23C 16/30 |
| | | | | 428/698 |
| 2004/0253446 | A1* | 12/2004 | Ljungberg | C23C 16/30 |
| | | | | 428/698 |
| 2006/0035111 | A1* | 2/2006 | Osada | C23C 16/32 |
| | | | | 428/702 |
| 2009/0170415 | A1* | 7/2009 | Tomita | C23C 16/0272 |
| | | | | 451/540 |
| 2012/0003452 | A1* | 1/2012 | Tomita | C23C 16/0272 |
| | | | | 428/216 |
| 2014/0287210 | A1* | 9/2014 | Tomita | C23C 16/0272 |
| | | | | 428/216 |

FOREIGN PATENT DOCUMENTS

| | | | |
|---|---|---|---|
| CN | 101243204 | A | 8/2008 |
| EP | 0530779 | A | 3/1993 |
| JP | 62-228305 | A | 10/1987 |
| JP | 08-001408 | A | 1/1996 |
| JP | 2000-158209 | * | 6/2000 |
| JP | 2006-198735 | A | 8/2006 |
| JP | 2006-297579 | A | 11/2006 |
| JP | 2006-326713 | A | 12/2006 |
| JP | 2009-279693 | * | 12/2009 |
| JP | 2010-221368 | A | 10/2010 |
| JP | 2013-063504 | A | 4/2013 |
| WO | WO-2013/038000 | A | 3/2013 |

OTHER PUBLICATIONS

International Search Report dated Aug. 18, 2015 for the corresponding PCT Application No. PCT/JP2015/065558.
Extended European Search Report dated Dec. 14, 2017 for the corresponding European Patent Application No. 15799293.4.

* cited by examiner

SURFACE-COATED CUTTING TOOL

CROSS-REFERENCE TO RELATED PATENT APPLICATIONS

This application is a U.S. National Phase Application under 35 U.S.C. § 371 of International Patent Application No. PCT/JP2015/065558, filed May 29, 2015, and claims the benefit of Japanese Patent Applications No. 2014-112772, filed May 30, 2014 and No. 2015-104021, filed May 21, 2015, all of which are incorporated by reference herein in their entireties. The International Application was published in Japanese on Dec. 3, 2015 as International Publication No. WO/2015/182746 under PCT Article 21(2).

FIELD OF THE INVENTION

The present invention relates to a surface-coated cutting tool (hereinafter, referred to as a coated tool) exhibiting excellent peeling resistance and chipping resistance over a long period of time. Particularly, a hard coating layer exhibits excellent peeling resistance and chipping resistance even in a case where cutting work of various steels, cast irons, and the like is performed at a high speed under high-speed intermittent heavy cutting conditions of high feed and high depth in which an intermittent and impact load is exerted a cutting edge.

BACKGROUND OF THE INVENTION

Coated tools are generally known in which a hard coating layer composed of the following (a) and (b) is deposited on a surface of a body made of a tungsten carbide (hereinafter, expressed by WC)-based cemented carbide or a titanium carbonitride (hereinafter, expressed by TiCN)-based cermet (hereinafter, these will be collectively referred to as a tool body).

(a) A Ti compound layer as a lower layer composed of one or more of a Ti carbide (hereinafter, expressed by TiC) layer, a Ti nitride (hereinafter, similarly expressed by TiN) layer, a Ti carbonitride (hereinafter, expressed by TiCN) layer, a Ti oxycarbide (hereinafter, expressed by TiCO) layer, and a Ti oxycarbonitride (hereinafter, expressed by TiCNO) layer.

(b) An aluminum oxide layer (hereinafter, expressed by an $Al_2O_3$ layer) as an upper layer having an α-type crystal structure in a chemically deposited state.

However, the above-described conventional coated tools exhibit excellent wear resistance in, for example, continuous cutting of various steels, cast irons, and the like, but in a case where the coated tool is used in high-speed intermittent cutting, peeling or chipping of the coating layer easily occurs, and there is a problem in that the tool life is reduced.

Therefore, various coated tools having improved upper and lower layers have been proposed in order to suppress peeling and chipping of the coating layer.

For example, Japanese Unexamined Patent Application, First Publication No. 2006-198735 discloses a coated tool obtained by depositing a hard coating layer composed of the following (a) and (b) on a surface of a tool body made of a WC-based cemented carbide or a TiCN-based cermet.

(a) A Ti compound layer as a lower layer composed of one or more of a Ti carbide layer, a Ti nitride layer, a Ti carbonitride layer, a Ti oxycarbide layer, and a Ti oxycarbonitride layer and having an average total layer thickness of 3 to 20 μm.

(b) An aluminum oxide layer as an upper layer with an average layer thickness of 1 to 15 μm having an α-type crystal structure in a chemically deposited state. Regarding this upper layer, a highest peak is present in Σ3 and a distribution ratio of Σ3 in the whole of ΣN+1 is 60 to 80% in a constituent atom-sharing lattice point distribution graph showing distribution ratios of individuals of ΣN+1 to the whole of ΣN+1, when electron beams are irradiated to the individual crystal grains having a corundum hexagonal crystal lattice in a measurement range of a polished surface by using a field-emission-type scanning electron microscope to measure inclined angles between normal lines of the (0001) plane and the (10-10) plane, which are crystal planes of the crystal grains, and a normal line of the polished surface; the crystal grains of this case have a corundum hexagonal crystal structure in which constituent atoms composed of Al and oxygen are present at lattice points, respectively; the distribution of coincidence grain boundary formed of lattice points (constituent atom-sharing lattice points) where the respective constituent atoms share one constituent atom between the crystal grains at an interface between the adjacent crystal grains is calculated on the basis of the resulting measured inclined angles; and when ΣN+1 represents the coincidence grain boundary formed of a constituent atom-sharing lattice point type in which there are N lattice points sharing no constituent atoms between the constituent atom-sharing lattice points (here, N is any even number equal to or more than 2 in the corundum hexagonal close-packed crystal structure, but in a case where the upper limit of N is 28 from the viewpoint of distribution frequency, even numbers 4, 8, 14, 24, and 26 do not exist).

This coated tool is known to exhibit excellent chipping resistance in high-speed intermittent cutting work.

PCT International Publication No. WO2013/038000 proposes that in a coated tool in which a surface of a tool body is coated with a lower layer and an aluminum oxide layer, or in a coated tool in which an interlayer interposed between a tool body and the lower layer is coated with an aluminum oxide layer formed on a lower layer, chipping resistance and crater wear resistance are improved by setting a Σ3-coincidence grain boundary ratio of the aluminum oxide layer to 80% or greater.

Japanese Unexamined Patent Application, First Publication No. 2013-63504 discloses a surface-coated cutting tool in which a hard coating layer composed of a Ti compound layer as a lower layer and an α-type $Al_2O_3$ layer as an upper layer is deposited, in which 30 to 70 area % of $Al_2O_3$ crystal grains immediately above the lower layer is constituted of (11-20)-oriented $Al_2O_3$ crystal grains, at least 45 area % of all $Al_2O_3$ crystal grains of the upper layer is constituted of (0001)-oriented $Al_2O_3$ crystal grains, and more preferably, an outermost surface layer of the lower layer is constituted of an oxygen-containing TiCN layer containing 0.5 to 3 atom % of oxygen only in a depth region with a depth of up to 500 nm. A value of a ratio between the number of oxygen-containing TiCN crystal grains of the outermost surface layer of the lower layer and the number of $Al_2O_3$ crystal grains at an interface between the lower layer and the upper layer is 0.01 to 0.5. Accordingly, it is proposed to improve peeling resistance and chipping resistance of the surface-coated cutting tool in high-speed heavy cutting and high-speed intermittent cutting.

TECHNICAL PROBLEM

In recent years, performance of cutting devices has been significantly improved, and there is strong demand for power saving, energy saving, and cost reduction in cutting work. In addition, the cutting work is performed at a higher speed and a high load tends to be exerted a cutting edge during heavy cutting, intermittent cutting, and the like with high depth and high feed. There are no problems in a case where the above-described conventional coated tools are used in continuous cutting of steel, cast irons, and the like under the normal conditions. However, in a case where the conventional coated tools are used under high-speed intermittent heavy cutting conditions, the adhesion strength between the lower layer made of a Ti compound layer and the upper layer made of an $Al_2O_3$ layer, which constitute the hard coating layer, is insufficient, and film toughness is also not sufficient.

Therefore, abnormal damage such as peeling and chipping between the upper layer and the lower layer is occurred, and the tool life is reached after a relatively short period of time.

SUMMARY OF THE INVENTION

Solution of the Problem

Accordingly, from the above-described viewpoint, the inventors have performed intensive study for improving abnormal damage resistance such as chipping and peeling and increasing a tool life by preventing the occurrence of abnormal damage such as peeling and chipping by improving adhesiveness between the lower layer made of a Ti compound layer and the upper layer made of an $Al_2O_3$ layer and improving toughness of the $Al_2O_3$ layer. As a result, they have found that in a coated tool in which a lower layer made of a Ti compound layer and an upper layer made of an $Al_2O_3$ layer are coated, in a case where, in a coincidence grain boundary distribution graph showing ratios of coincidence grain boundary lengths formed of respective constituent atom-sharing lattice points to the whole coincidence grain boundary length of the $Al_2O_3$ layer, a highest peak is present in $\Sigma 3$ in the range of $\Sigma 3$ to $\Sigma 29$, a distribution ratio of a $\Sigma 3$-coincidence grain boundary is increased, and a ratio of the grain boundary having a constituent atom-sharing lattice point type of $\Sigma 3$ continuing from an interface between the lower layer and the upper layer to an outermost surface of the upper layer is increased, peeling resistance is improved.

The invention has been completed as a result of intensive study based on the above-described knowledge, and has the following aspects.

(1) A surface-coated cutting tool including: a tool body that is made of a tungsten carbide-based cemented carbide or a titanium carbonitride-based cermet; and a hard coating layer that is deposited on a surface of the tool body, in which the hard coating layer has a lower layer that is formed on the surface of the tool body and an upper layer that is formed on the lower layer, (a) the lower layer is made of a Ti compound layer, which has an average total layer thickness of 3 to 20 μm, and is composed of two or more of a TiC layer, a TiN layer, a TiCN layer, a TiCO layer, and a TiCNO layer, the Ti compound layer including at least one TiCN layer, (b) the upper layer is made of an $Al_2O_3$ layer, which has an average layer thickness of 2 to 20 μm and has an α-type crystal structure in a chemically deposited state, (c) regarding $Al_2O_3$ crystal grains of the upper layer, in a coincidence grain boundary distribution graph showing ratios of coincidence grain boundaries formed of the respective constituent atom-sharing lattice point type, to the whole coincidence grain boundary length in the range of $\Sigma 3$ to $\Sigma 29$, a highest peak is present in $\Sigma 3$ in the range of $\Sigma 3$ to $\Sigma 29$, and a distribution ratio of $\Sigma 3$ in the range of $\Sigma 3$ to $\Sigma 29$ is 70% or more, when electron beams are irradiated to the individual crystal grains in a measurement range of a polished cross-section by using a field-emission-type scanning electron microscope and an electron beam backward scattering diffraction device to measure an orientation of a normal line of each of crystal lattice planes having a corundum hexagonal crystal lattice, a crystal orientation relationship between the adjacent crystal lattices is calculated based on the measurement result, a distribution of coincidence grain boundary formed of lattice points (referred to as "constituent atom-sharing lattice points") where each of constituent atoms of a crystal lattice interface shares one constituent atom between the crystal lattices is calculated, and distribution ratios of individuals of $\Sigma N+1$ are calculated when $\Sigma N+1$ represents the constituent atom-sharing lattice point type in which there are N lattice points sharing no constituent atoms between the constituent atom-sharing lattice points (here, N is any even number equal to or more than 2 in the corundum hexagonal close-packed crystal structure, but in a case where the upper limit of N is 28 from the viewpoint of distribution frequency, even numbers 4, 8, 14, 24, and 26 do not exist), and (d) a ratio of a grain boundary having a constituent atom-sharing lattice point type of $\Sigma 3$ continuing from an interface between the lower layer and the upper layer to an outermost surface of the upper layer is 60% or more of a grain boundary having a constituent atom-sharing lattice point type of $\Sigma 3$ distributed in the $Al_2O_3$ crystal grains of the entire upper layer.

(2) The surface-coated cutting tool according to (1), in which an outermost surface layer of the lower layer (a) is made of a TiCN layer having a layer thickness of at least 500 nm or more and contains oxygen only in a depth region with a depth of up to 500 nm from an interface between the TiCN layer and the upper layer, except for oxygen as inevitable impurities, and an average content of the oxygen contained in the depth region is 1 to 3 atom % of a total content of Ti, C, N, and O contained in the depth region.

(3) The surface-coated cutting tool according to (1) or (2), in which a highest peak is present in an inclined angle division in which an inclined angle with respect to the normal line of the surface of the tool body is in the range of 0 to 10 degrees, and a total of frequencies present in the inclined angle division of the $Al_2O_3$ crystal grains having an inclined angle of 0 to 10 degrees is 70% or more of the entire frequencies in an inclined angle frequency distribution graph in a case where, regarding the $Al_2O_3$ crystal grains of the upper layer, electron beams are irradiated to the individual crystal grains having a corundum hexagonal crystal lattice in a measurement range of a polished cross-section by using a field-emission-type scanning electron microscope and an electron beam backward scattering diffraction device to measure inclined angles between normal lines of the (0001) planes that are crystal planes of the crystal grains and a normal line of the surface of the tool body in the range of 0 to 45 degrees.

(4) The surface-coated cutting tool according to any one of (1) to (3), in which an area ratio of crystal grains having an aspect ratio of 5 or more is 80% or more of the $Al_2O_3$ crystal grains of the upper layer.

Advantageous Effects of Invention

According to the coated tool of the invention, the distribution ratio of the $\Sigma 3$-coincidence grain boundary in regard to the upper layer of the hard coating layer is increased to be 70% or more, and 60% or more of the $\Sigma 3$-coincidence grain boundary in regard to the upper layer is continuously formed from the interface between the lower layer and the upper layer to the outermost surface of the upper layer. Accordingly, crystal grain boundary strength in the upper layer of the coated tool is increased, and thus excellent peeling resistance and chipping resistance are exhibited.

In addition, the outermost surface layer of the lower layer of the invention is made of a TiCN layer (hereinafter, also referred to as an oxygen-containing TiCN layer) containing oxygen. Accordingly, adhesion strength between the upper layer and the lower layer of the coated tool can be improved, and a ratio of frequencies present in the inclined angle division of 0 to 10 degrees can be further increased, whereby wear resistance can be further improved.

Furthermore, an area ratio of crystal grains having an aspect ratio of 5 or more is 80% or more of the $Al_2O_3$ crystal grains of the upper layer, and thus excellent wear resistance is exhibited. In addition, a total of frequencies present in the inclined angle division of 0 to 10 degrees of the $Al_2O_3$ crystal grains of the upper layer is 70% or more of the entire frequencies, and thus wear resistance is further improved.

Therefore, according to the coated tool of the invention, even in a case where cutting work of various steels, cast irons, and the like is performed at a high speed under high feed and high depth high-speed intermittent heavy cutting conditions in which an intermittent and impact load is exerted a cutting edge, excellent wear resistance is exhibited over a long-term of usage with no occurrence of abnormal damage such as peeling and chipping.

DETAILED DESCRIPTION OF THE INVENTION

Figure 1:
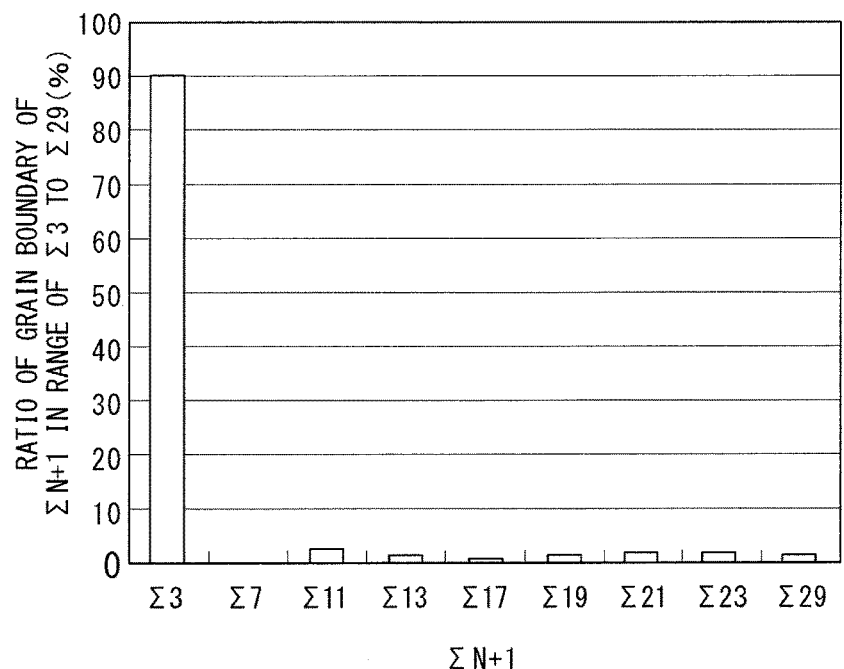
FIG. 1 shows an example of a coincidence grain boundary distribution graph regarding an invention coated tool.

Here, embodiments of the invention will be described in detail.

(a) Lower Layer:

Basically, a Ti compound layer (for example, TiC layer, TiN layer, TiCN layer, TiCO layer, and TiCNO layer) constituting a lower layer is present as a layer below an $Al_2O_3$ layer, and imparts high-temperature strength to a hard coating layer due to excellent high-temperature strength of a Ti compound. In addition, the Ti compound layer as the lower layer tightly adheres to both of a surface of a tool body and the upper layer made of the $Al_2O_3$ layer, and is exerted to maintain adhesion of the hard coating layer to the tool body. However, in a case where the average total layer thickness of the Ti compound layer as the lower layer is less than 3 μm, the above-described action cannot be sufficiently exhibited. In a case where the average total layer thickness of the Ti compound layer as the lower layer is greater than 20 μm, thermoplastic deformation easily occurs particularly during high-speed heavy cutting or high-speed intermittent cutting accompanied by generation of high-temperature heat, and uneven wear is caused. Due to the above-described reasons, the average total layer thickness of the Ti compound layer as the lower layer is set to 3 to 20 μm. The average total layer thickness of the Ti compound layer as the lower layer is preferably 5 to 15 μm, but is not limited thereto.

(b) Outermost Surface Layer of Lower Layer:

The lower layer (also including an outermost surface layer of the lower layer) according to the embodiment of the invention can be formed under the same chemical vapor deposition conditions as in the conventional methods, but an outermost surface layer of the lower layer is desirably formed as follows.

That is, first, various Ti compound layers composed of one or more of a TiC layer, a TiN layer, a TiCN layer, a TiCO layer, and a TiCNO layer are deposited (only a TiCN layer may be deposited) using a normal chemical vapor deposition device. Then, as an outermost surface layer of the lower layer, an oxygen-containing TiCN layer is formed by performing chemical vapor deposition under the following conditions using the same normal chemical vapor deposition device.

Composition of Reaction Gas (vol %): 2 to 10% of $TiCl_4$, 0.5 to 1.0% of $CH_3CN$, 25 to 60% of $N_2$, $H_2$ as balance Reaction Atmosphere Temperature: 750° C. to 930° C.

Reaction Atmosphere Pressure: 5 to 15 kPa

That is, the lower layer according to the embodiment of the invention preferably includes an oxygen-containing TiCN layer that is an outermost surface layer of the lower layer and is formed under the above-described conditions after formation of one or more various Ti compound layers. In addition, in the step of forming the outermost surface layer of the lower layer, during 5 minutes to 30 minutes before termination of the deposition time required for obtaining a predetermined layer thickness, a CO gas is added in an amount of 1 to 5 vol % with respect to the entire amount of the reaction gas to perform chemical vapor deposition. Accordingly, an average content of the oxygen contained in a depth region with a depth of up to 500 nm in a layer thickness direction of the outermost surface layer of the lower layer from an interface between the outermost surface of the lower layer and the upper layer can be adjusted to 1 to 3 atom % of a total content of Ti, C, N, and O, and thus an oxygen-containing TiCN layer having the above-described average oxygen content is easily deposited. In a depth region deeper than 500 nm in the film thickness direction of the outermost surface layer of the lower layer from the interface between the outermost surface layer of the lower layer and the upper layer, oxygen is permitted to be contained in an amount of less than 0.5 atom % as inevitable impurities. Therefore, the expression "containing no oxygen" defined in the invention averages that the content of oxygen is less than 0.5 atom % in a strict sense.

The outermost surface layer of the lower layer made of the oxygen-containing TiCN layer may be formed with a layer thickness of at least 500 nm or more in order to form, for example, preferable $Al_2O_3$ crystal grains thereon (see the following (c)), and the oxygen contained in the depth region with a depth of up to 500 nm in the layer thickness direction from the interface between the oxygen-containing TiCN layer and the upper layer may be contained in an amount of 1 to 3 atom % of a total content of Ti, C, N, and O. Accordingly, oxygen may be contained only in the depth region with a depth of up to 500 nm in the film thickness direction of the oxygen-containing TiCN layer.

Here, the reason why the depth region of the oxygen-containing TiCN layer is limited as described above is that in a case where oxygen is contained in a region deeper than 500 nm, the structure form of the outermost surface of the TiCN layer easily changes from a columnar structure to a granular structure. In addition, a constituent atom-sharing lattice point type of the $Al_2O_3$ crystal grains immediately above the outermost surface layer of the lower layer is unlikely to become a desired form.

In a case where average oxygen content in the depth region with a depth of up to 500 nm is less than 1 atom %, the degree of improvement in the adhesion strength between the upper layer and TiCN of the lower layer is likely to be reduced. In addition, a constituent atom-sharing lattice point type of the $Al_2O_3$ crystal grains immediately above the outermost surface layer of the lower layer is unlikely to be obtained. In a case where the average oxygen content in the depth region is greater than 3 atom %, a distribution ratio of $\Sigma3$ in the range of $\Sigma3$ to $\Sigma29$ is less than 70% in $Al_2O_3$ of the upper layer immediately above the outermost surface layer of the lower layer, and high-temperature hardness of the upper layer is likely to be reduced. The average content of oxygen contained in the depth region with a depth of up to 500 nm in the above-described oxygen-containing TiCN layer is preferably 1.2 to 2.5 atom %, but is not limited thereto.

Here, the average oxygen content is the content of oxygen (O), expressed by atom % (=O/(Ti+C+N+O)×100), in a total content of titanium (Ti), carbon (C), nitrogen (N), and oxygen (O) in the depth region with a depth of up to 500 nm in the layer thickness direction of the TiCN layer from the interface between the TiCN layer constituting the outermost surface layer of the lower layer and the upper layer.

The lower layer according to the embodiment of the invention can be formed under the same chemical vapor deposition conditions as in the conventional methods, but as the outermost surface layer of the lower layer according to the embodiment of the invention, the above-described oxygen-containing TiCN layer is desirably formed.

(c) $Al_2O_3$ Crystal Grains of Upper Layer:

After the oxygen-containing TiCN layer of (b) is deposited as the outermost surface layer of the lower layer, an $Al_2O_3$ layer as the upper layer is formed under the following conditions.

That is, a surface of the oxygen-containing TiCN layer formed in (b) is treated under the following conditions.

<Lower Layer Surface Treatment>
Composition of Reaction Gas (vol %): 2 to 10% of CO, 2 to 10% of $CO_2$, $H_2$ as balance
Atmosphere Temperature: 900° C. to 950° C.
Atmosphere Pressure: 5 to 15 kPa
Treatment Time: 20 to 60 min Next, initial growth of $Al_2O_3$ is performed under the following deposition conditions, and then an $Al_2O_3$ top layer is deposited to form the upper layer made of $Al_2O_3$ crystal grains having a predetermined constituent atom-sharing lattice point type. The $Al_2O_3$ initial growth step is performed to securely form a predetermined upper layer. In the embodiment of the invention, a target layer thickness of the upper layer is a total of film thicknesses formed in the $Al_2O_3$ initial growth step and an $Al_2O_3$ top layer-forming step.

<Initial Growth of $Al_2O_3$>
Composition of Reaction Gas (vol %): 0.5 to 3% of $AlCl_3$, 1 to 5% of $CO_2$, 0.5 to 2.0% of HCl, $H_2$ as balance
Atmosphere Temperature: 950° C. to 1040° C.
Atmosphere Pressure: 5 to 15 kPa
Treatment Time: 10 to 120 min <Formation of $Al_2O_3$ Top Layer>
Composition of Reaction Gas (vol %): 1 to 3% of $AlCl_3$, 3 to 15% of $CO_2$, 1 to 3% of HCl, 0.5 to 1.5% of $H_2S$, $H_2$ as balance
Reaction Atmosphere Temperature: 950° C. to 1040° C.
Reaction Atmosphere Pressure: 5 to 15 kPa Treatment Time: (until target upper layer thickness is obtained)

In a case where the layer thickness of the entire upper layer is less than 2 μm, excellent high-temperature strength and high-temperature hardness cannot be exhibited over a long-term of usage, and in a case where the layer thickness is greater than 20 μm, chipping easily occurs. Accordingly, the layer thickness of the upper layer is set to 2 to 20 μm. The layer thickness of the upper layer is preferably 3 to 15 μm, but is not limited thereto.

In the embodiment of the invention, the treatment time of the lower layer surface treatment step is set to 20 to 60 min Accordingly, the ratio of the $\Sigma3$-coincidence grain boundary continuing from the interface between the lower layer and the upper layer to the outermost surface of the upper layer can be increased. In addition, the atmosphere temperature in the lower layer surface treatment step is set to 900° C. to 950° C. Accordingly, adhesiveness of the interface between the outermost surface layer of the lower layer and the upper layer is improved. The treatment time of the lower layer surface treatment step is preferably 25 to 45 min, but is not limited thereto. In addition, the reaction atmosphere temperature in the surface treatment for the lower layer is preferably 900° C. to 930° C., but is not limited thereto.

In the reaction gas in the $Al_2O_3$ top layer-forming step, the amount of $AlCl_3$ added is preferably 1.5 to 2.5%, the amount of $CO_2$ added is preferably 5 to 10%, the amount of HCl added is preferably 1.5 to 2.5%, and the amount of $H_2S$ added is preferably 0.75 to 1.25%, but the amounts are not limited thereto.

In a case where, regarding the $Al_2O_3$ crystal grains having an α-type crystal structure constituting the upper layer, a coincidence grain boundary formed of a constituent atom-sharing lattice point type thereof is analyzed in detail using a field-emission-type scanning electron microscope and an electron beam backward scattering diffraction device, a highest peak is present in $\Sigma3$ in the range of $\Sigma3$ to $\Sigma29$, and a distribution ratio of $\Sigma3$ occupies 70% or greater of a distribution ratio within a range of $\Sigma3$ to $\Sigma29$ in a coincidence grain boundary distribution graph.

In the embodiment of the invention, among the above-described film-forming conditions of (c), the amounts of $CO_2$ and $H_2S$ added in the $Al_2O_3$ top layer-forming step are adjusted. Accordingly, in the coincidence grain boundary distribution graph of the upper layer, a highest peak is present in $\Sigma3$ in the range of $\Sigma3$ to $\Sigma29$, and a distribution ratio of $\Sigma3$ is likely to be 70% or greater of a distribution ratio within a range of $\Sigma3$ to $\Sigma29$. Here, in a case where the highest peak is not present in $\Sigma3$ or the distribution ratio of $\Sigma3$ is less than 70%, the $Al_2O_3$ crystal grains do not have sufficient grain boundary strength, and thus a suppressing effect on the occurrence of chipping, defect, and the like in a case where a high load is exerted is not sufficient.

Accordingly, in this embodiment of the invention, in the coincidence grain boundary distribution graph of the upper layer, a peak is present in $\Sigma3$ in the range of $\Sigma3$ to $\Sigma29$, and a distribution ratio of $\Sigma3$ in the range of $\Sigma3$ to $\Sigma29$ is set to 70% or greater. The distribution ratio of $\Sigma3$ in the range of $\Sigma3$ to $\Sigma29$ is preferably 75 to 90%, but is not limited thereto.

The constituent atom-sharing lattice point type of the upper layer can be measured according to the following procedures.

First, a longitudinal section (a cross-section vertical to a surface of a coated tool) of a coated tool is treated to be a polished surface.

Next, using a field-emission-type scanning electron microscope and an electron beam backward scattering diffraction device, individual crystal grains having a corundum hexagonal crystal lattice present in a measurement range of the polished cross-section are irradiated with electron beams to measure angles of orientations of normal lines of crystal lattice planes.

From the results of the measurement, a crystal orientation relationship between the adjacent crystal lattices is calculated, and the distribution of lattice points ("constituent atom-sharing lattice points") where each of constituent atoms constituting a crystal lattice interface shares one constituent atom between the crystal lattices is calculated.

In a case where $\Sigma N+1$ represents the constituent atom-sharing lattice point type in which there are N lattice points sharing no constituent atoms between the constituent atom-sharing lattice points (here, N is any even number equal to or more than 2 in the crystal structure of the corundum hexagonal crystal lattice, but in a case where the upper limit of N is 28 from the viewpoint of distribution frequency, even numbers 4, 8, 14, 24, and 26 do not exist), distribution ratios of individuals of $\Sigma N+1$ are calculated, and a coincidence grain boundary distribution graph (see FIG. 1) showing the distribution ratios of individuals of $\Sigma N+1$ in a total distribution ratio of the whole unit form of the whole grain boundary length in the range of $\Sigma 3$ to $\Sigma 29$ is made. Accordingly, the presence of a peak in $\Sigma 3$ and the distribution ratio of $\Sigma 3$ in the range of $\Sigma 3$ to $\Sigma 29$ can be obtained.

The reason why the coincidence grain boundary of $\Sigma 29$ or less is distinguished from the coincidence grain boundary of $\Sigma 31$ or more is that it has been reported that from the viewpoint of distribution frequency, the coincidence grain boundary of $\alpha\text{-}Al_2O_3$ is a main coincidence grain boundary in which a grain boundary is from $\Sigma 3$ to $\Sigma 29$ with the upper limit of N set to 28 as shown in the article of H. Grimmer, etc. (Philosophical Magazine A, 1990, Vol. 61, No. 3,493-509). The coincidence grain boundary of each of $\Sigma 3$, $\Sigma 7$, $\Sigma 11$, $\Sigma 17$, $\Sigma 19$, $\Sigma 21$, $\Sigma 23$, and $\Sigma 29$ was identified using a value of an angle formed between crystal grains constituting the coincidence grain boundary as shown in the above-described article. In addition, from the coincidence grain boundary of $\Sigma N+1$ satisfying the constituent atom-sharing lattice point type in which there are N lattice points sharing no constituent atoms between the constituent atom-sharing lattice points between the adjacent crystal lattices, a criterion of a permissible error $\Delta\theta$ of the value of the angle formed between the crystal grains was estimated at $\Delta\theta=5°$.

In the embodiment of the invention, the ratio of the $\Sigma 3$-coincidence grain boundary continuing from the interface between the lower layer and the upper layer to the outermost surface of the upper layer can be adjusted to 60% or greater by depositing the $Al_2O_3$ layer as the upper layer through the above-described step of forming $Al_2O_3$ crystal grains of the upper layer of (c). Accordingly, grain boundary strength between the $Al_2O_3$ crystal grain structures in the upper layer can be increased, and thus chipping resistance of the $Al_2O_3$ crystal grains can be further increased. Therefore, excellent peeling resistance and chipping resistance can be exhibited in high-speed intermittent cutting work. The ratio of the $\Sigma 3$-coincidence grain boundary continuing from the interface between the lower layer and the upper layer to the outermost surface of the upper layer is preferably 65 to 80%, but is not limited thereto.

In the embodiment of the invention, among the above-described film-forming conditions of (c), by adjusting the amounts of $AlCl_3$ and $H_2S$ added in the $Al_2O_3$ top layer-forming step, a frequency ratio of the $Al_2O_3$ crystal grains having an inclined angle of 0 to 10 degrees in an inclined angle frequency distribution graph of the upper layer can be adjusted to 70% or greater of the entire frequencies.

As a result, high-temperature hardness of the upper layer is improved, and wear resistance is improved.

The inclined angle frequency distribution of the $Al_2O_3$ crystal grains of the upper layer and the frequency ratio of the $Al_2O_3$ crystal grains having an inclined angle of 0 to 10 degrees can be obtained as follows.

First, individual crystal grains having a corundum hexagonal crystal lattice present in a measurement range of a polished cross-section including the upper layer of the coated tool are irradiated with electron beams to obtain data related to orientation of the $Al_2O_3$ crystal grains. In a case where, based on this data, inclined angles between normal lines of the (0001) planes that are crystal planes of the crystal grains and a normal line of the surface of the tool body are measured, the measured inclined angles in the range of 0 to 45 degrees among the measured inclined angles are divided every pitch of 0.25 degrees, and expressed by an inclined angle frequency distribution graph made by totalizing the frequencies present within the respective divisions. A total of the frequencies present in the inclined angle divisions of the $AL_2O_3$ crystal grains having an inclined angle of 0 to 10 degrees is measured as a frequency ratio in the entire frequencies in the inclined angle frequency distribution graph (see FIG. 2).

By relatively increasing a ratio of a $CO_2$ gas amount and a $H_2S$ gas amount to an $AlCl_3$ gas amount in the above-described deposition conditions, a value of the inclined angle of the normal line of the (0001) plane of the $Al_2O_3$ crystal grains obtained according to the above-described procedures can be obtained such that a ratio of frequencies present in the inclined angle division of 0 to 10 degrees in the inclined angle frequency distribution graph is 60% or greater of the entire frequencies. In a case where (0001)-oriented $Al_2O_3$ crystal grains, that is, $Al_2O_3$ crystal grains present in the inclined angle division where the inclined angle of the normal lines of the (0001) planes is 0 to 10 degrees are less than 70% of the entire frequencies in the inclined angle frequency distribution graph, high-temperature strength and high-temperature hardness are reduced.

Accordingly, in the embodiment of the invention, regarding the $Al_2O_3$ crystal grains of the upper layer, a total of frequencies of the crystal grains in which the inclined angle between the normal lines of the (0001) planes of the $Al_2O_3$ crystal grains and the normal line of the surface of the tool body was in the range of 0 to 10 degrees was set to 70% or greater of the entire frequencies in the inclined angle frequency distribution graph. A frequency ratio of the $Al_2O_3$ crystal grains having an inclined angle of 0 to 10 degrees in the inclined angle frequency distribution graph of the upper layer is preferably 75 to 85% of the entire frequencies, but is not limited thereto.

In addition, in the embodiment of the invention, among the above-described film-forming conditions of (c), by adjusting the amounts of $CO_2$ and HCl added, an area ratio of crystal grains having an aspect ratio of 5 or greater can be adjusted to 80% or greater of the $Al_2O_3$ crystal grains of the upper layer. Accordingly, wear resistance of the upper layer can be further improved. In a case where the area ratio of crystal grains having an aspect ratio of 5 or greater is less than 80%, a crack propagation suppression effect is caused in high-speed intermittent heavy cutting work, but an improvement in the high-temperature strength and the high-temperature hardness cannot be expected. Therefore, the area ratio of crystal grains having an aspect ratio of 5 or greater is desirably 80% or greater. The area ratio of crystal grains having an aspect ratio of 5 or greater among the $Al_2O_3$ crystal grains of the upper layer is preferably 85% or greater, but is not limited thereto.

The coated tool of the invention will be described in detail based on examples. Particularly, the layers constituting the hard coating layer of the coated tool of the invention will be described in detail.

EXAMPLES

A WC powder, a TiC powder, a ZrC powder, a TaC powder, a NbC powder, a $Cr_3C_2$ powder, a TiN powder, and a Co powder having an average grain size of 1 to 3 μm were prepared as raw material powders. These raw material powders were blended according to a blending composition shown in Table 1. Wax was added and mixed therewith using a ball mill for 24 hours in acetone and dried under reduced pressure. Thereafter, the resulting material was press-formed into a green compact having a predetermined shape at a pressure of 98 MPa, and this green compact was vacuum-sintered by being kept at a predetermined temperature of 1370° C. to 1470° C. for 1 hour in a vacuum of 5 Pa. After sintering, tool bodies A to E made of a WC-based cemented carbide and having an insert shape defined in ISO-CNMG120408 were produced.

A TiCN powder (TiC/TiN=50/50 in terms of mass ratio), a ZrC powder, a TaC powder, a NbC powder, a $Mo_2C$ powder, a WC powder, a Co powder, and a Ni powder having an average grain size of 0.5 to 2 μm were prepared as raw material powders. These raw material powders were blended according to a blending composition shown in Table 2, wet-mixed using a ball mill for 24 hours, and dried. Thereafter, the resulting material was press-formed into a green compact at a pressure of 98 MPa, and this green compact was sintered by being kept at a temperature of 1500° C. for 1 hour under a nitrogen atmosphere of 1.3 kPa. After sintering, tool bodies a to e made of a TiCN-based cermet and having an insert shape defined in ISO-CNMG120412 were produced.

Next, each of the tool bodies A to E and a to e was put into a normal chemical vapor deposition device to produce each of invention coated tools 1 to 13 according to the following procedures.

(a) First, under conditions shown in Table 3, a Ti compound layer was deposited as a lower layer so as to have a target layer thickness shown in Table 7.

(b) Next, under conditions shown in Table 4, an oxygen-containing TiCN layer (that is, oxygen was contained such that an average oxygen content (O/(Ti+C+N+O)×100) was 1 to 3 atom % only in a depth region with a depth of up to 500 nm in a film thickness direction of the outermost surface layer of the lower layer from an interface between the outermost surface layer of the lower layer and the upper layer) was formed as an outermost surface layer of the lower layer so as to have a target layer thickness shown in Table 8. In the oxygen-containing TiCN layer type D of Table 4, a CO gas was not added during 5 to 30 minutes before termination of the deposition time.

(c) Next, under conditions shown in Table 5, an oxidation treatment (lower layer surface treatment) was performed on the TiCN layer as the outermost surface of the lower layer using a mixture gas of CO and $CO_2$. In the lower layer surface treatment type D of Table 5, the reaction atmosphere temperature was changed.

(d) Next, initial growth of $Al_2O_3$ was performed under initial growth conditions shown in Table 6, and deposition was performed under top layer-forming conditions shown in Table 6 until a target layer thickness shown in Table 8 was obtained to produce the each of invention coated tools 1 to 13. In the initial growth condition type D of Table 6, the amount of $CO_2$ supplied was changed in the composition of the reaction gas. In addition, in the top layer-forming condition type d of Table 6, the amounts of $CO_2$ and $H_2S$ supplied were changed in the composition of the reaction gas.

For comparison, the steps (c) and (d) were performed under conditions departing from the production conditions of the invention coated tools 1 to 13, and thus each of comparative example coated tools 1 to 13 shown in Table 9 were produced.

Next, regarding the TiCN layer constituting the outermost surface layer of the lower layer in each of the invention coated tools 1 to 13 and the comparative example coated tools 1 to 13, the average oxygen content (O/(Ti+C+N+O)×100) in a depth region with a depth of up to 500 nm in a layer thickness direction of the TiCN layer as the lower layer, and the average oxygen content (O/(Ti+C+N+O)×100) in a depth region deeper than 500 nm were measured. The average oxygen content was obtained as follows: using an Auger electron spectral analyzer, a polished cross-section of the coated tool was irradiated with electron beams having a diameter of 10 nm in a distance range corresponding to the film thickness of the Ti carbide layer from the outermost surface of the Ti carbonitride layer of the lower layer to measure intensities of Auger peaks of Ti, C, N, and O, and a ratio of the Auger peak intensity of O was calculated from the sum of the peak intensities.

In addition, in order to obtain the content of the oxygen inevitably contained in the TiCN layer of the lower layer, a TiCN layer of a lower layer was separately formed by performing chemical deposition under the following conditions on the surface of a tool body made of a tungsten carbide-based cemented carbide or a titanium carbonitride-based cermet.

Composition of Reaction Gas (vol %): 2 to 10% of $TiCl_4$, 0.5 to 1.0% of $CH_3CN$, 25 to 60% of $N_2$, $H_2$ as balance Reaction Atmosphere Temperature: 750° C. to 930° C.

Reaction Atmosphere Pressure: 5 to 15 kPa

Accordingly, a TiCN (hereinafter, referred to as inevitable oxygen-containing TiCN) layer intentionally containing no oxygen was formed with a layer thickness of 3 μm or greater. The content of the oxygen contained inevitably in a region deeper than 500 nm in a layer thickness direction from a surface of the inevitable oxygen-containing TiCN layer was obtained from a ratio of the content of O to a total content of Ti, C, N, and O contained in the depth region using an Auger electron spectral analyzer. As a result, the content of the inevitable oxygen obtained within an accuracy range of the Auger electron spectral analyzer was less than 0.5 atom %, and from this, the content of the oxygen inevitably contained in the TiCN layer was set to 0.5 atom %.

The value obtained by subtracting the inevitable oxygen content (that is, 0.5 atom %) from the above-described average oxygen content was obtained as an average oxygen content of the TiCN layer constituting the outermost surface layer of the lower layer.

The values are shown in Tables 8 and 9.

Next, regarding $Al_2O_3$ of the upper layer of the hard coating layer, angles of normal lines of crystal lattice planes of the $Al_2O_3$ crystal grains were measured using a field-emission-type scanning electron microscope and an electron beam backward scattering diffraction device. From the results of the measurement, a crystal orientation relationship between the adjacent crystal lattices was calculated to measure the coincidence grain boundary distribution of $Al_2O_3$ of the upper layer.

FIG. 1 shows an example of the coincidence grain boundary distribution graph obtained through the measurement in regard to the upper layer of the invention coated tool 1.

From FIG. 1, in a case of the invention coated tool 1, it was found that a highest peak is formed in $\Sigma 3$ in the range of $\Sigma 3$ to $\Sigma 29$, and a distribution ratio of a $\Sigma 3$-coincidence grain boundary in the range of $\Sigma 3$ to $\Sigma 29$ is 89%, and thus exceeds 70%.

Whether the $\Sigma 3$-coincidence grain boundary of $Al_2O_3$ of the upper layer continues from the interface between the lower layer and the upper layer to the outermost surface of the upper layer was observed using a field-emission-type scanning electron microscope and an electron beam backward scattering diffraction device.

The ratio of the $\Sigma 3$-coincidence grain boundary continuing from the interface between the lower layer and the upper layer to the outermost surface of the upper layer was obtained according to the following procedures.

First, using a field-emission-type scanning electron microscope and an electron beam backward scattering diffraction device, a polished cross-section (a cross-section vertical to a surface of the upper layer) of the upper layer of the invention coated tool was irradiated with electron beams having an acceleration voltage of 15 kV at an incident angle of 70 degrees and an emission current of 1 nA to irradiate individual crystal grains having a corundum hexagonal crystal lattice present in a measurement range of the polished cross-section with the electron beams at intervals of 0.1 μm/step. The measurement range was a region that was 50 μm wide in a direction parallel to the surface of the body and whose upper limit was a layer thickness of the $Al_2O_3$ layer in a direction perpendicular to the direction of the surface of the body. In addition, the measurement range had a length of at least 3 μm in the direction perpendicular to the direction of the surface of the body. Based on an electron beam backward scattering diffraction image obtained by applying electron beams at intervals of 0.1 μm/step using an electron beam backward scattering diffraction device, angles of orientations of the normal lines of the crystal lattice planes were measured.

From the results of the measurement, a crystal orientation relationship between the adjacent crystal lattices was calculated, and a coincidence grain boundary map formed of constituent atom-sharing lattice points where each of constituent atoms of a crystal lattice interface shares one constituent atom between the crystal lattices was made.

In the whole grain boundary length of the $\Sigma 3$-coincidence grain boundary in which the number of lattice points that did not share any constituent atoms between the constituent atom-sharing lattice points was one, a value of a grain boundary length of a $\Sigma 3$-grain boundary present continuously from the interface between the lower layer and the upper layer to the outermost surface of the $Al_2O_3$ crystal grains of the upper layer was obtained and divided by a value of the whole grain boundary length of the $\Sigma 3$-coincidence grain boundary to calculate a ratio of the $\Sigma 3$-coincidence grain boundary continuing from the interface between the lower layer and the upper layer to the outermost surface of the upper layer.

As a result, for example, in the invention coated tool 1, it was found that the $\Sigma 3$-coincidence grain boundary continuing from the interface between the lower layer and the upper layer to the outermost surface of the upper layer is 60% or more of the whole grain boundary length.

The aspect ratio of the $Al_2O_3$ crystal grains of the upper layer was obtained according to the following procedures.

Using a field-emission-type scanning electron microscope and an electron beam backward scattering diffraction device, a polished cross-section of the upper layer of the invention coated tool was irradiated with electron beams having an acceleration voltage of 15 kV at an incident angle of 70 degrees and an emission current of 1 nA to irradiate individual crystal grains having a corundum hexagonal crystal lattice present in a measurement range of the polished cross-section with the electron beams at intervals of 0.1 μm/step. The measurement range was a region that was 50 μm wide in a direction parallel to the surface of the body and whose upper limit was a layer thickness of the $Al_2O_3$ layer in a direction perpendicular to the direction of the surface of the body. In addition, the measurement range had a length of at least 2 μm in the direction perpendicular to the direction of the surface of the body. Based on an electron beam backward scattering diffraction image obtained by applying electron beams at intervals of 0.1 μm/step using an electron beam backward scattering diffraction device, inclined angles between normal lines of the (0001) planes that were crystal planes of the crystal grains and a normal line of the surface of the tool body were measured. In addition, orientation differences (rotational angles) between the respective crystal lattices were measured from differences between Euler angles of the respective crystal lattices. At that time, in a case where the difference in orientation (rotational angle) between the crystal lattices at adjacent measurement points was 5 degrees or greater, a boundary between the adjacent measurement points was set as a crystal grain boundary. A range that was surrounded by the crystal grain boundary and not divided by another crystal grain boundary was specified as the same crystal grains. Regarding the respective specified crystal grains, lengths of a long axis in a direction perpendicular to the direction of the surface of the tool body and a short axis in a direction parallel to the direction of the surface of the tool body were obtained, and from a ratio therebetween, an aspect ratio was obtained. An area ratio of crystal grains having an aspect ratio of 5 or greater was calculated by measurement in a region of 50 μm in a transverse direction×a film thickness of the upper layer in a longitudinal direction at 2,000-fold magnification using a field-emission-type scanning electron microscope in a cross-section subjected to mirror polishing.

Regarding $Al_2O_3$ of the upper layer, a frequency distribution of inclined angles of the normal lines of the (0001) planes of the $Al_2O_3$ crystal grains was measured using a field-emission-type scanning electron microscope and an electron beam backward scattering diffraction device according to the following procedures.

First, a measurement range (for example, 0.3 μm in a thickness direction of the upper layer×50 μm in a direction parallel to the surface of the tool body) in a polished cross-section of the upper layer was set in a lens tube of the field-emission-type scanning electron microscope. Next, the polished cross-section was irradiated with electron beams having an acceleration voltage of 15 kV at an incident angle of 70 degrees and an emission current of 1 nA to irradiate individual crystal grains having a corundum hexagonal crystal lattice present within the measurement range of the polished cross-section with the electron beams at intervals of 0.1 μm/step. The measurement range was a region that was 50 μm wide in a direction along the surface of the body and whose upper limit was a layer thickness of the $Al_2O_3$ layer in a direction perpendicular to the direction of the surface of the body. In addition, the measurement range had a length of at least 2 μm in the direction perpendicular to the direction of the surface of the body. Based on an electron beam backward scattering diffraction image obtained by applying electron beams at intervals of 0.1 μm/step using an electron beam backward scattering diffraction device, inclined angles between the normal lines of the (0001) planes that were crystal planes of the crystal grains and the normal line of the surface of the tool body were measured. The measured inclined angles in the range of 0 to 45 degrees among the measured inclined angles (hereinafter, referred to as "measured inclined angles") were divided every pitch of 0.25 degrees, and expressed by an inclined angle frequency distribution graph made by totalizing the frequencies present within the respective divisions. Thereafter, a total of the frequencies present in the inclined angle divisions of the $Al_2O_3$ crystal grains having an inclined angle of 0 to 10 degrees was obtained as a frequency ratio in the entire frequencies in the inclined angle frequency distribution graph.

Figure 2:
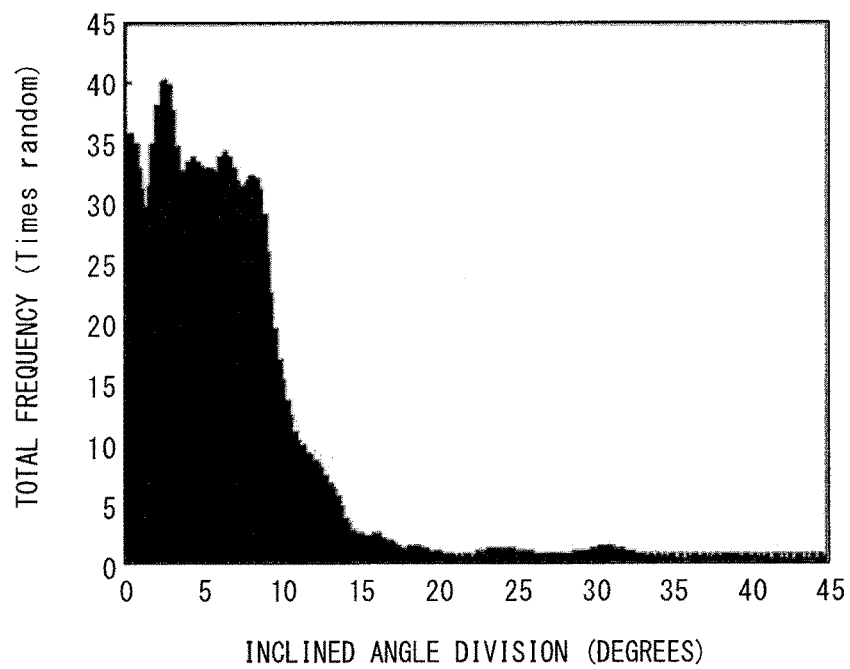
FIG. 2 shows an example of an inclined angle frequency distribution graph regarding the invention coated tool.

FIG. 2 shows an inclined angle frequency distribution graph obtained regarding the upper layer of the invention coated tool 1.

From FIG. 2, it was found that regarding the upper layer of the invention coated tool 1, a frequency ratio of the $Al_2O_3$ crystal grains present in the inclined angle division of 0 to 10 degrees is 85%, and thus exceeds 70%.

In addition, regarding the upper layer of the comparative example coated tool, a coincidence grain boundary in which a highest peak is present in the range of Σ3 to Σ29 in a constituent atom-sharing lattice point distribution graph, a distribution ratio of a Σ3-coincidence grain boundary, and a ratio of the Σ3-coincidence grain boundary continuing from the interface between the lower layer and the upper layer to the outermost surface of the upper layer, an aspect ratio, an inclined angle division in which a highest peak is present in an inclined angle frequency distribution graph, and a frequency ratio of the $Al_2O_3$ crystal grains present in an inclined angle division of 0 to 10 degrees were obtained in the same manner as in the case of the invention coated tool.

The values thereof are shown in Tables 8 and 9.

Figure 3:
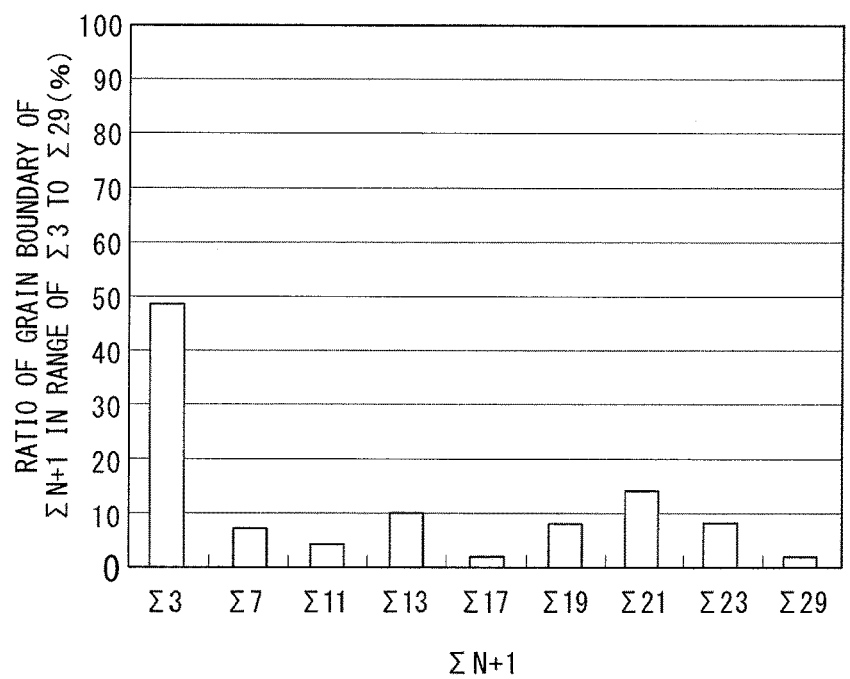
FIG. 3 shows an example of a coincidence grain boundary distribution graph regarding a comparative invention coated tool.

FIG. 3 shows a coincidence grain boundary distribution graph obtained regarding the upper layer of the comparative example coated tool 1.

Figure 4:
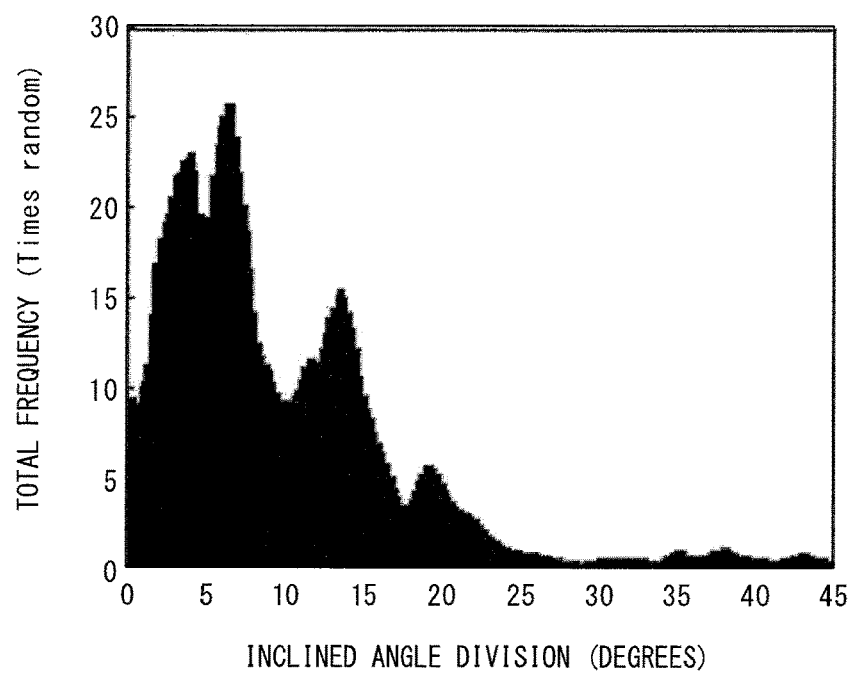
FIG. 4 shows an example of an inclined angle frequency distribution graph regarding the comparative example coated tool.

FIG. 4 shows an inclined angle frequency distribution graph obtained regarding the upper layer of the comparative example coated tool 1.

As shown in FIGS. 1, 2, 3, and 4 and Tables 8 and 9, regarding the upper layers of all the invention coated tools, the highest peak was present in Σ3 in the range of Σ3 to Σ29, and the distribution ratio of Σ3 was 70% or greater in all of the coated tools. Furthermore, the ratio of the Σ3-coincidence grain boundary continuing from the interface between the lower layer and the upper layer to the outermost surface of the upper layer was 60% or greater. In contrast, in cases of the comparative example coated tools, the highest peak was not present in Σ3 in the range of Σ3 to Σ29, the distribution ratio of Σ3 was less than 70%, or the ratio of the Σ3-coincidence grain boundary continuing from the interface between the lower layer and the upper layer to the outermost surface of the upper layer was less than 60%.

Therefore, the invention coated tools were excellent in toughness, hardness, and strength of the upper layer, and thus excellent peeling resistance and chipping resistance were exhibited, but the comparative example coated tools were insufficient in peeling resistance and chipping resistance under high-speed intermittent heavy cutting conditions.

Thicknesses of the constituent layers of the hard coating layer in each of the invention coated tools 1 to 13 and the comparative example coated tools 1 to 13 were measured (longitudinal section measurement) using a scanning electron microscope, and all of the layers had an average layer thickness (an average value obtained through the measurement at 5 points) that was substantially the same as a target layer thickness.

TABLE 1

| Type | | Blending Composition (mass %) | | | | | | |
|---|---|---|---|---|---|---|---|---|
| | | Co | TiC | ZrC | TaC | NbC | $Cr_3C_2$ | TiN | WC |
| Tool body | A | 5.5 | 1.0 | 1.0 | — | 2.5 | — | 2.0 | Balance |
| | B | 5.9 | — | 1.5 | 1.5 | 1.0 | — | — | Balance |
| | C | 6.8 | 1.5 | — | 0.5 | 1.5 | 0.3 | 1.5 | Balance |
| | D | 8.4 | — | 1.5 | 1.0 | — | — | 1.5 | Balance |
| | E | 10.7 | 2.0 | — | — | 2.0 | 0.3 | — | Balance |

TABLE 2

| Type | | Blending Composition (mass %) | | | | | | | |
|---|---|---|---|---|---|---|---|---|---|
| | | Co | Ni | ZrC | TaC | NbC | $Mo_2C$ | WC | TiCN |
| Tool body | a | 8.5 | 7.5 | 1.5 | 5.5 | 0.5 | 9.5 | 11.0 | Balance |
| | b | 7.5 | 6.5 | 1.0 | — | — | 11.0 | 6.5 | Balance |
| | c | 11.0 | 5.5 | — | 7.5 | 2.0 | 8.0 | 10.5 | Balance |
| | d | 12.0 | 4.0 | 2.0 | — | 1.0 | 8.5 | 8.0 | Balance |
| | e | 12.6 | 4.5 | 1.0 | 5.5 | — | 4.5 | 7.5 | Balance |

TABLE 3

| Lower Layer (Ti compound layer) | | Forming Conditions (pressure of reaction atmosphere is represented by kPa, and temperature is represented by ° C.) | | |
|---|---|---|---|---|
| Type | Target Composition (numbers indicate atomic ratio) | Composition of Reaction Gas (vol %) | Reaction Atmosphere | |
| | | | Pressure | Temperature |
| TiC Layer | TiC | $TiCl_4$: 4.2%, $CH_4$: 8.5%, $H_2$: Balance | 7 | 1020 |
| TiN Layer (first layer) | TiN | $TiCl_4$: 4.2%, $N_2$: 30%, $H_2$: Balance | 30 | 900 |
| TiN Layer (another layer) | TiN | $TiCl_4$: 4.2%, $N_2$: 35%, $H_2$: Balance | 50 | 1040 |
| l-TiCN Layer *1 | $TiC_{0.5}N_{0.5}$ | $TiCl_4$: 4.2%, $N_2$: 20%, $CH_3CN$: 0.6%, $H_2$: Balance | 7 | 880 |
| TiCN Layer | $TiC_{0.5}N_{0.5}$ | $TiCl_4$: 4.2%, $N_2$: 20%, $CH_4$: 4%, $H_2$: Balance | 12 | 1000 |

TABLE 3-continued

| Lower Layer (Ti compound layer) | | Forming Conditions (pressure of reaction atmosphere is represented by kPa, and temperature is represented by °C.) | | |
|---|---|---|---|---|
| Type | Target Composition (numbers indicate atomic ratio) | Composition of Reaction Gas (vol %) | Reaction Atmosphere Pressure | Temperature |
| TiCO Layer | $TiC_{0.5}O_{0.5}$ | $TiCl_4$: 4.2%, CO: 4%, $H_2$: Balance | 7 | 1020 |
| TiCNO Layer | $TiC_{0.2}N_{0.3}O_{0.5}$ | $TiCl_4$: 4.2%, CO: 4%, $CH_4$: 3%, $N_2$: 20%, $H_2$: Balance | 20 | 1020 |

*1 A TiCN layer having a longitudinal growth crystal structure

TABLE 4

| Oxygen-Containing TiCN Layer Type | Composition of Reaction Gas (vol %) | Forming Conditions (pressure of reaction atmosphere is represented by kPa, and temperature is represented by °C.) | | Additive CO Gas During 5 to 30 Minutes Before Termination of Deposition (vol %) |
|---|---|---|---|---|
| | | Reaction Atmosphere Pressure | Temperature | |
| A | $TiCl_4$: 5%, $CH_3CN$: 1%, $N_2$: 35%, Balance: $H_2$ | 7 | 870 | 3 |
| B | $TiCl_4$: 2%, $CH_3CN$: 0.5%, $N_2$: 25%, Balance: $H_2$ | 15 | 750 | 5 |
| C | $TiCl_4$: 10%, $CH_3CN$: 0.8%, $N_2$: 60%, Balance: $H_2$ | 5 | 930 | 1 |
| D (out of range of the invention) | $TiCl_4$: 2.5%, $CH_3CN$: 1.2%, $N_2$: 45%, Balance: $H_2$ | 8 | 830 | — |

TABLE 5

| Lower Layer Surface Treatment Type | Composition of Reaction Gas (vol %) | Treatment Conditions (pressure of reaction atmosphere is represented by kPa, and temperature is represented by °C.) | | Treatment Time (min) |
|---|---|---|---|---|
| | | Reaction Atmosphere Pressure | Temperature | |
| A | CO: 4%, $CO_2$: 4%, $H_2$: Balance | 5 | 900 | 30 |
| B | CO: 10%, $CO_2$: 10%, $H_2$: Balance | 15 | 930 | 20 |
| C | CO: 2%, $CO_2$: 2%, $H_2$: Balance | 7 | 950 | 60 |
| D (out of range of the invention) | CO: 7%, $CO_2$: 3%, $H_2$: Balance | 10 | 1000 | 45 |

TABLE 6

| Formation of Hard Coating Layer | | | Forming Conditions (pressure of reaction atmosphere is represented by kPa, and temperature is represented by °C.) | |
|---|---|---|---|---|
| Step Type | Formation Symbol | Composition of Reaction Gas (vol %) | Reaction Atmosphere Pressure | Temperature |
| Initial Growth Conditions | A | $AlCl_3$: 2%, $CO_2$: 1%, HCl: 1%, $H_2$: Balance | 7 | 950 |
| | B | $AlCl_3$: 3%, $CO_2$: 5%, HCl: 2%, $H_2$: Balance | 15 | 1000 |
| | C | $AlCl_3$: 0.5%, $CO_2$: 2%, HCl: 0.5%, $H_2$: Balance | 5 | 1040 |
| | D (out of range of the invention) | $AlCl_3$: 2%, $CO_2$: 8%, HCl: 1.5%, $H_2$: Balance | 7 | 980 |
| Top Layer-Forming Conditions | a | $AlCl_3$: 2%, $CO_2$: 3%, HCl: 2%, $H_2S$: 1.5%, $H_2$: Balance | 7 | 950 |
| | b | $AlCl_3$: 1%, $CO_2$: 5%, HCl: 1%, $H_2S$: 1.0%, $H_2$: Balance | 15 | 1000 |
| | c | $AlCl_3$: 3%, $CO_2$: 15%, HCl: 3%, $H_2S$: 0.5%, $H_2$: Balance | 5 | 1040 |
| | D (out of range of the invention) | $AlCl_3$: 2%, $CO_2$: 2%, HCl: 1%, $H_2S$: 0.3%, $H_2$: Balance | 7 | 980 |

TABLE 7

| Type | Tool body Symbol | First Layer | Hard Coating Layer Lower Layer (numerical values on lower side indicate target average layer thickness (μm) of each layer) | | |
|---|---|---|---|---|---|
| | | | Second Layer | Third Layer | Fourth Layer |
| Invention Coated Tools and Comparative Example Coated Tools | 1 | A | TiN (0.5) | l-TiCN (4.5) | — | — |
| | 2 | a | TiC (1) | TiCN (7) | — | — |
| | 3 | B | TiC (0.5) | TiN (0.5) | l-TiCN (10) | — |
| | 4 | b | TiN (1) | TiCN (4) | l-TiCN (7) | — |
| | 5 | C | TiC (1) | TiCN (6.5) | TiCNO (0.5) | — |
| | 6 | c | TiN (1) | TiC (0.5) | TiCN (7) | TiCO (0.5) |
| | 7 | d | TiC (0.5) | l-TiCN (3) | — | — |
| | 8 | D | TiC (1) | l-TiCN (5) | TiN (0.5) | TiCN (1) |
| | 9 | E | TiC (1) | TiCN (1.5) | — | — |
| | 10 | e | TiN (0.5) | TiCN (3.5) | l-TiCN (3) | — |
| | 11 | A | TiC (1) | TiN (1) | l-TiCN (17) | — |
| | 12 | c | TiN (0.5) | TiCN (8) | TiC (0.5) | l-TiCN (6) |
| | 13 | b | TiN (1) | l-TiCN (12) | — | — |

TABLE 8

| | | | Hard Coating Layer | | | | | |
|---|---|---|---|---|---|---|---|---|
| | | | Outermost Surface Layer of Lower Layer | | | | Upper Layer | |
| Type | Tool body Symbol | Oxygen-Containing TiCN Layer Type (see Table 4) | Average Oxygen Content in Depth Region with Depth of up to 500 nm in Layer Thickness Direction (atom %) | Maximum Oxygen Content in Depth Region Deeper Than 500 nm in Layer Thickness Direction (atom %) | Target Layer Thickness (μm) | Lower Layer Surface Treatment Type (see Table 5) | Initial Growth Conditions (see Table 6) | Top Layer Forming Conditions (see Table 6) |
| Invention Coated Tools | 1 | A | A | 1.5 | 0.3 | 0.5 | A | A | a |
| | 2 | a | B | 2.6 | 0.5 | 0.8 | A | B | b |
| | 3 | B | A | 1.6 | 0.3 | 1.2 | C | C | c |
| | 4 | b | C | 1.1 | 0.2 | 1.5 | B | A | c |
| | 5 | C | B | 2.4 | 1.1 | 0.6 | C | C | b |
| | 6 | c | C | 1.3 | 0.7 | 1.0 | A | B | c |
| | 7 | d | D | 0.7 | 0.2 | 0.8 | B | B | a |
| | 8 | D | A | 1.8 | 0.4 | 1.3 | C | A | b |
| | 9 | E | C | 1.0 | 0.3 | 0.5 | B | C | b |
| | 10 | e | B | 3.0 | 0.5 | 1.3 | A | A | c |
| | 11 | A | C | 1.3 | 0.3 | 0.9 | C | B | b |
| | 12 | c | A | 1.9 | 0.3 | 1.1 | A | C | c |
| | 13 | b | B | 2.1 | 0.4 | 0.6 | B | A | a |

| | | | Hard Coating Layer Upper Layer | | | | | |
|---|---|---|---|---|---|---|---|---|
| | | | | Constituent Atom-sharing Lattice Point Distribution | | Ratio of Σ3 Continuing from Interface with Lower Layer to Outermost Surface (%) | Area Ratio of Crystal Grains Having Aspect Ratio of 5 or Greater (%) | Inclined angle Division in which Highest Peak is Present (degrees) | Ratio of Frequencies in Range of 0 to 10 Degrees in Inclined Angle Frequency Distribution (%) |
| Type | | Target Layer Thickness (μm) | Maximum Peak in Range of Σ3 to Σ29 | Distribution Ratio of Σ3 (%) | | | | |
| Invention Coated Tools | 1 | 8.0 | Σ3 | 89 | 72 | 84 | 2.50 to 2.75 | 85 |
| | 2 | 20.0 | Σ3 | 91 | 76 | 93 | 0.75 to 1.00 | 81 |
| | 3 | 11.0 | Σ3 | 84 | 70 | 86 | 1.50 to 1.75 | 79 |
| | 4 | 3.5 | Σ3 | 76 | 66 | 74 | 3.00 to 3.25 | 73 |
| | 5 | 7.5 | Σ3 | 80 | 73 | 83 | 2.25 to 2.50 | 80 |
| | 6 | 2.0 | Σ3 | 74 | 68 | 55 | 8.25 to 8.50 | 65 |
| | 7 | 4.0 | Σ3 | 71 | 60 | 51 | 11.00 to 11.25 | 56 |
| | 8 | 3.0 | Σ3 | 77 | 69 | 85 | 4.75 to 5.00 | 79 |
| | 9 | 6.0 | Σ3 | 76 | 71 | 71 | 3.25 to 3.50 | 75 |
| | 10 | 5.0 | Σ3 | 82 | 68 | 83 | 3.00 to 3.25 | 80 |
| | 11 | 8.0 | Σ3 | 90 | 77 | 91 | 1.25 to 1.50 | 83 |
| | 12 | 3.0 | Σ3 | 72 | 65 | 76 | 6.75 to 7.00 | 75 |
| | 13 | 15.0 | Σ3 | 86 | 73 | 88 | 0.25 to 0.50 | 82 |

TABLE 9

| | | | | Outermost Surface Layer of Lower Layer | | | Upper Layer | | | |
|---|---|---|---|---|---|---|---|---|---|---|
| | | | | | Average Oxygen Content in Depth Region with Depth of up to 500 nm in Layer Thickness Direction (atom %) | Maximum Oxygen Content in Depth Region Deeper Than 500 nm in Layer Thickness Direction (atom %) | | | | |
| Type | | Tool body Symbol | Oxygen-Containing TiCN Layer Type (see Table 4) | | | | Target Layer Thickness (μm) | Lower Layer Surface Treatment Type (see Table 5) | Initial Growth Conditions (see Table 6) | Top Layer Forming Conditions (see Table 6) | Target Layer Thickness (μm) |
| Comparative Example Coated Tools | 1 | A | A | 1.5 | 0.3 | 0.5 | D | D | d | 8.0 |
| | 2 | a | B | 2.6 | 0.5 | 0.8 | B | A | d | 20.0 |
| | 3 | B | A | 1.6 | 0.3 | 1.2 | C | D | b | 11.0 |
| | 4 | b | C | 1.1 | 0.2 | 1.5 | D | B | c | 3.5 |
| | 5 | C | B | 2.4 | 1.1 | 0.6 | A | A | d | 7.5 |
| | 6 | c | C | 1.3 | 0.7 | 1.0 | B | D | a | 2.0 |
| | 7 | d | D | 0.7 | 0.2 | 0.8 | C | D | c | 4.0 |
| | 8 | D | A | 1.8 | 0.4 | 1.3 | D | C | b | 3.0 |
| | 9 | E | C | 1.0 | 0.3 | 0.5 | B | B | d | 6.0 |
| | 10 | e | B | 3.0 | 0.5 | 1.3 | C | A | d | 5.0 |
| | 11 | A | C | 1.3 | 0.3 | 0.9 | A | D | b | 8.0 |
| | 12 | c | A | 1.9 | 0.3 | 1.1 | B | D | b | 3.0 |
| | 13 | b | B | 2.1 | 0.4 | 0.6 | D | B | b | 15.0 |

| | | Hard Coating Layer Upper Layer | | | | | |
|---|---|---|---|---|---|---|---|
| | | Constituent Atom-sharing Lattice Point Distribution | | Ratio of Σ3 Continuing from Interface with Lower Layer to Outermost Surface (%) | Area Ratio of Crystal Grains Having Aspect Ratio of 5 or Greater (%) | Inclined angle Division in which Highest Peak is Present (degrees) | Ratio of Frequencies in Range of 0 to 10 Degrees in Inclined Angle Frequency Distribution (%) |
| Type | | Maximum Peak in Range of Σ3 to Σ29 | Distribution Ratio of Σ3 (%) | | | | |
| Comparative Example Coated Tools | 1 | Σ3 | 48 | 40 | 50 | 6.25 to 6.50 | 61 |
| | 2 | Σ3 | 62 | 49 | 65 | 9.75 to 10.00 | 64 |
| | 3 | Σ21 | 28 | 29 | 41 | 12.00 to 12.25 | 42 |
| | 4 | Σ19 | 30 | 35 | 45 | 14.50 to 14.75 | 31 |
| | 5 | Σ3 | 54 | 56 | 44 | 8.50 to 8.75 | 50 |
| | 6 | Σ21 | 31 | 41 | 28 | 11.25 to 11.50 | 35 |
| | 7 | Σ19 | 37 | 32 | 51 | 9.00 to 9.25 | 48 |
| | 8 | Σ3 | 47 | 40 | 66 | 4.25 to 4.50 | 59 |
| | 9 | Σ7 | 31 | 40 | 42 | 8.75 to 9.00 | 44 |
| | 10 | Σ19 | 33 | 45 | 32 | 13.75 to 14.00 | 38 |
| | 11 | Σ3 | 59 | 51 | 62 | 7.75 to 8.00 | 55 |
| | 12 | Σ21 | 32 | 46 | 50 | 10.50 to 10.75 | 48 |
| | 13 | Σ3 | 66 | 52 | 72 | 5.50 to 5.75 | 64 |

Next, regarding the various coated tools of the invention coated tools 1 to 13 and the comparative example coated tools 1 to 13, a cutting test, a dry high-speed intermittent cutting test of nickel-chromium-molybdenum alloy steel (cutting conditions A), a dry high feed and high depth intermittent cutting test (cutting conditions B), and a dry high-speed intermittent cutting test of ductile cast iron (cutting conditions C), which will be described below, were performed in a state in which the coated tool was screw-fixed to a tip end portion of a turning tool made of tool steel by a fixing tool, and a width of flank wear of a cutting edge was measured.

Cutting Conditions A:
Workpiece: 4 Longitudinal grooves formed at equal intervals in a longitudinal direction of JIS·SNCM439
Cutting Speed: 350 m/min
Cutting Depth: 1.5 mm
Feed Rate: 0.35 mm/rev
Cutting Time: 5 minutes
(Normal cutting speed and feed rate are 250 m/min and 0.3 mm/rev, respectively.)
Cutting Conditions B:
Workpiece: 4 Longitudinal grooves formed at equal intervals in a longitudinal direction of JIS·S45C
Cutting Speed: 350 m/min
Cutting Depth: 3.0 mm
Feed Rate: 0.3 mm/rev
Cutting Time: 5 minutes
(Normal cutting speed, cutting depth, and feed rate are 200 m/min, 1.5 mm, and 0.3 mm/rev, respectively.)
Cutting Conditions C:
Workpiece: Round bar with 4 longitudinal grooves formed at equal intervals in a longitudinal direction of JIS·FCD450
Cutting Speed: 350 m/min
Cutting Depth: 2.0 mm
Feed Rate: 0.35 mm/rev
Cutting Time: 5 minutes
(Normal cutting speed, cutting depth, and feed rate are 250 m/min, 1.5 mm, and 0.3 mm/rev, respectively.)
The results of the measurement are shown in Table 10. The above-described normal cutting speed is a cutting speed at which efficiency in using a conventional coated insert (generally, the number of components that can be processed until the end of the tool life) is optimized When the cutting is performed at a speed exceeding the above speed, the tool life is excessively reduced, and processing efficiency is reduced.

TABLE 10

| Type | | Width of Flank Wear (mm) | | | Type | | Cutting Test Results (min) | | |
|---|---|---|---|---|---|---|---|---|---|
| | | Cutting Conditions (A) | Cutting Conditions (B) | Cutting Conditions (C) | | | Cutting Conditions (A) | Cutting Conditions (B) | Cutting Conditions (C) |
| Invention Coated Tools | 1 | 0.20 | 0.21 | 0.17 | Comparative Example Coated Tools | 1 | **2.0 | *2.4 | *2.2 |
| | 2 | 0.17 | 0.19 | 0.14 | | 2 | *1.1 | *1.4 | **1.1 |
| | 3 | 0.22 | 0.18 | 0.19 | | 3 | *1.8 | **2.2 | *2.1 |
| | 4 | 0.27 | 0.24 | 0.28 | | 4 | **1.6 | *1.9 | **1.7 |
| | 5 | 0.24 | 0.20 | 0.22 | | 5 | **1.9 | **2.3 | *1.5 |
| | 6 | 0.28 | 0.30 | 0.31 | | 6 | *2.6 | **2.2 | **2.4 |
| | 7 | 0.32 | 0.31 | 0.33 | | 7 | **1.4 | *2.0 | *1.6 |
| | 8 | 0.21 | 0.18 | 0.21 | | 8 | *2.2 | **2.5 | *2.6 |
| | 9 | 0.29 | 0.28 | 0.24 | | 9 | *1.4 | **1.0 | **1.7 |
| | 10 | 0.23 | 0.20 | 0.18 | | 10 | *1.8 | **1.9 | *2.1 |
| | 11 | 0.19 | 0.20 | 0.17 | | 11 | **1.6 | *1.5 | **2.0 |
| | 12 | 0.27 | 0.25 | 0.29 | | 12 | **1.2 | **1.6 | *1.9 |
| | 13 | 0.16 | 0.18 | 0.16 | | 13 | *2.0 | *2.1 | **2.3 |

(In the table, the symbol * indicates peeling occurring in the hard coating layer, and the symbol ** indicates a cutting time until the service life is reached due to chipping occurring in the hard coating layer.)

From the results shown in Table 10, in each of the invention coated tools 1 to 13, the upper layer thereof had excellent high-temperature strength, high-temperature toughness, and high-temperature hardness, and thus excellent wear resistance was exhibited over a long-term of usage with no occurrence of abnormal damage such as peeling and chipping.

On the other hand, in the comparative example coated tools 1 to 13, the service life was reached after a relatively short period of time due to the occurrence of peeling and chipping of the hard coating layer in high-speed intermittent heavy cutting work.

INDUSTRIAL APPLICABILITY

As described above, a coated tool of the invention exhibits excellent cutting performance over a long-term of usage with no occurrence of peeling of a hard coating layer and chipping in continuous cutting or intermittent cutting of various steels, cast irons, and the like under normal conditions, and even under severe cutting conditions such as high-speed intermittent heavy cutting in which a high intermittent and impact load is exerted a cutting edge. Therefore, it is possible for the coated tool of the invention to sufficiently satisfy high performance of cutting device, power saving and energy saving in cutting work, and cost saving.

The invention claimed is:
1. A surface-coated cutting tool, comprising:
a tool body that is made of a tungsten carbide cemented carbide or a titanium carbonitride cermet; and
a hard coating layer that is deposited on a surface of the tool body,
wherein the hard coating layer has a lower layer that is formed on the surface of the tool body and an upper layer that is formed on the lower layer,
(a) the lower layer is made of a Ti compound layer, which has an average total layer thickness of 3 to 20 μm, and is composed of two or more of a TiC layer, a TiN layer, a TiCN layer, a TiCO layer, and a TiCNO layer, the Ti compound layer including at least one TiCN layer,

(b) the upper layer is made of an $Al_2O_3$ layer, which has an average layer thickness of 2 to 20 μm and has an α-type crystal structure in a chemically deposited state, (c) regarding $Al_2O_3$ crystal grains of the entire upper layer, in a coincidence grain boundary distribution graph showing ratios of coincidence grain boundaries formed of the respective constituent atom-sharing lattice point type, to the whole coincidence grain boundary length in the range of Σ3 to Σ29, a highest peak is present in Σ3 in the range of Σ3 to Σ29, and a distribution ratio of Σ3 in the range of Σ3 to Σ29 is 70% or more, when electron beams are irradiated to the individual crystal grains in a measurement range of a polished cross-section by using a field-emission-type scanning electron microscope and an electron beam backward scattering diffraction device to measure an orientation of a normal line of each of crystal lattice planes having a corundum hexagonal crystal lattice, a crystal orientation relationship between the adjacent crystal lattices is calculated based on the measurement result, a distribution of lattice points (referred to as "constituent atom-sharing lattice points") where each of constituent atoms of a crystal lattice interface shares one constituent atom between the crystal lattices is calculated, and distribution ratios of individuals of ΣN+1 are calculated when ΣN+1 represents the constituent atom-sharing lattice point type in which there are N lattice points sharing no constituent atoms between the constituent atom-sharing lattice points (here, N is any even number equal to or more than 2 in the corundum hexagonal close-packed crystal structure, but in a case where the upper limit of N is 28 from the viewpoint of distribution frequency, even numbers 4, 8, 14, 24, and 26 do not exist), and (d) a ratio of a grain boundary having a constituent atom-sharing lattice point type of Σ3 continuing from an interface between the lower layer and the upper layer to an outermost surface of the upper layer is 60% or more of a grain boundary having a constituent atom-sharing lattice point type of Σ3 distributed in the $Al_2O_3$ crystal grains of the entire upper layer, and wherein an outermost surface layer of the lower layer (a) is made of a TiCN layer having a layer thickness of at least 500 nm or more and contains oxygen only in a depth region with a depth of up to 500 nm from an interface between the TiCN layer and the upper layer, except for oxygen as inevitable impurities, and an average content of the oxygen contained in the depth region is 1 to 3 atom % of a total content of Ti, C, N, and O contained in the depth region.

2. The surface-coated cutting tool according to claim 1, wherein a highest peak is present in an inclined angle division in which an inclined angle with respect to the normal line of the surface of the tool body is in the range of 0 to 10 degrees, and a total of frequencies present in the inclined angle division of the $Al_2O_3$ crystal grains having an inclined angle of 0 to 10 degrees is 70% or more of the entire frequencies in an inclined angle frequency distribution graph in a case where, regarding the $Al_2O_3$ crystal grains of the upper layer, electron beams are irradiated to the individual crystal grains having a corundum hexagonal crystal lattice in a measurement range of a polished cross-section by using a field-emission-type scanning electron microscope and an electron beam backward scattering diffraction device to measure inclined angles between normal lines of the (0001) planes that are crystal planes of the crystal grains and a normal line of the surface of the tool body in the range of 0 to 45 degrees.

3. The surface-coated cutting tool according to claim 2, wherein an area ratio of crystal grains having an aspect ratio of 5 or more is 80% or more of the $Al_2O_3$ crystal grains of the upper layer.

4. The surface-coated cutting tool according to claim 1, wherein an area ratio of crystal grains having an aspect ratio of 5 or more is 80% or more of the $Al_2O_3$ crystal grains of the upper layer.

5. The surface-coated cutting tool according to claim 1, wherein the upper layer is formed by an initial growth step and a top layer formation step.

6. The surface-coated cutting tool according to claim 5, wherein in the top layer formation step, a reaction gas containing 1 to 3 vol % of $AlCl_3$ is treated under a pressure of 5 to 15 kPa.

7. The surface-coated cutting tool according to claim 6, wherein the reaction gas further contains 1 to 1.5 vol % of $H_2S$.

* * * * *